US 8,853,046 B2

(12) United States Patent
Lu et al.

(10) Patent No.: US 8,853,046 B2
(45) Date of Patent: Oct. 7, 2014

(54) USING TION AS ELECTRODES AND SWITCHING LAYERS IN RERAM DEVICES

(75) Inventors: Nan Lu, San Jose, CA (US); Chien-Lan Hsueh, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 128 days.

(21) Appl. No.: 13/397,968

(22) Filed: Feb. 16, 2012

(65) Prior Publication Data

US 2013/0214236 A1    Aug. 22, 2013

(51) Int. Cl.
*H01L 21/20*    (2006.01)

(52) U.S. Cl.
USPC ........... 438/382; 438/104; 438/584; 438/685; 438/210; 257/4; 257/2; 257/5

(58) Field of Classification Search
CPC ... H01L 45/08; H01L 45/145; H01L 45/1266; H01L 45/1233; H01L 45/00
USPC .............................. 257/4, E45.003; 438/382
See application file for complete search history.

(56) References Cited

U.S. PATENT DOCUMENTS

| | | | |
|---|---|---|---|
| 7,084,078 B2 | 8/2006 | Ahn et al. | |
| 7,476,951 B2 | 1/2009 | Campbell et al. | |
| 2006/0228868 A1 | 10/2006 | Ahn | |
| 2007/0259111 A1* | 11/2007 | Singh et al. | 427/248.1 |
| 2010/0167463 A1* | 7/2010 | Sung | 438/104 |
| 2011/0233508 A1* | 9/2011 | Araki et al. | 257/4 |
| 2012/0049146 A1* | 3/2012 | Liu | 257/4 |

OTHER PUBLICATIONS

Kwak et al. ("Roles of interfacial TiOxN1—x layer and TiN electrode on bipolar resistive switching in TiN/TiO2 /TiN frameworks" Applied Physics Letters 96, Published Jun. 1, 2010).*

Kim, S., et al.; High dielectric constant TiO2 thin films on a Ru electrode grown at 250 Cby AtomicLayer Deposition; Nov. 1, 2004; Seoul National University Industry Foundation; Applied Physics Letters V.85 N. 18 1112004.

Chen, Y.S., et al.; Highly Scalable Hafnium Oxide Memory with Improvements of Resistive Distribution and Read Disturb Immunity; Jan. 1, 2009; Industrial Technology Research Institute; pp. IEDM09108.

Schroeder, H., et al.; Resistive Switching in a PtTiO2Pt Thin Film Stack a Candidate for a NonVolatile ReRAM; Jan. 1, 2007; Research Center Julich, Germany; Microelectronic Engineering pp. 19821985.

Gao, B., et al.; OxideBased RRAM Uniformity Improvement Using a New MaterialOriented Methodology; Jan. 1, 2009; Peking University; 2009 Symposium on VLSI Technology Digest of Technical Papers 2 pages.

Vallee, C. et al.; High j for MIM and RRAM applications Impact of the metallic electrode and oxygen vacancies; Jan. 1, 2009; Elsevier Sequoia; Microelectronic Engineering 86 17741776.

Wang, Wei, et al.; Elimination of Forming Process for TiOx Nonvolatile Memory Devices; Jul. 1, 2009; IEEE; IEEE Electron Device Letters vol. 30 No. 7.

Sg Park, et al.; Theoretical Study of the Resistance Switching Mechanism in Rutile TiO2x for ReRam The role of oxygen vacancies and hydrogen impurities; Jan. 1, 2011; Department of Materials Science and Engineering, Stanford University; Unknown.

Qi Liu et al.; Controllable Growth of Nanoscale Conductive Filaments in SolidElectrolyteBased ReRAM by Using a Metal Nanocrystal Covered Bottom Electrode; Jan. 1, 2010; American Chemical Society; Unknown.

* cited by examiner

*Primary Examiner* — Asok K Sarkar
*Assistant Examiner* — Dmitriy Yemelyanov

(57) ABSTRACT

A single TiON film is used to form a ReRAM device by varying the oxygen and nitrogen content throughout the device to form the electrodes and switching layer. A ReRAM device that can be formed in a single deposition chamber is also disclosed. The ReRAM device can be formed by forming a first titanium nitride layer, forming a titanium oxynitride-titanium oxide-titanium oxynitride layer, and then forming a second titanium nitride.

11 Claims, 8 Drawing Sheets

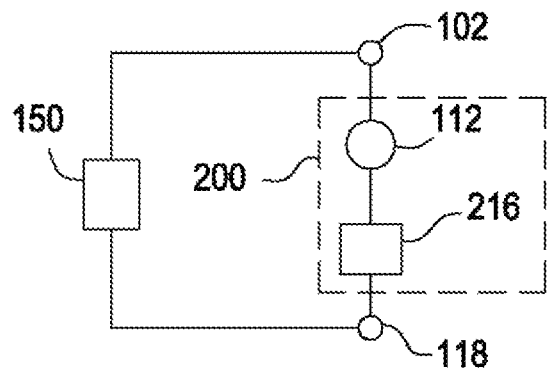
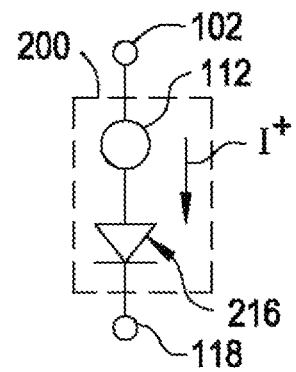
FIG. 2A  FIG. 2B
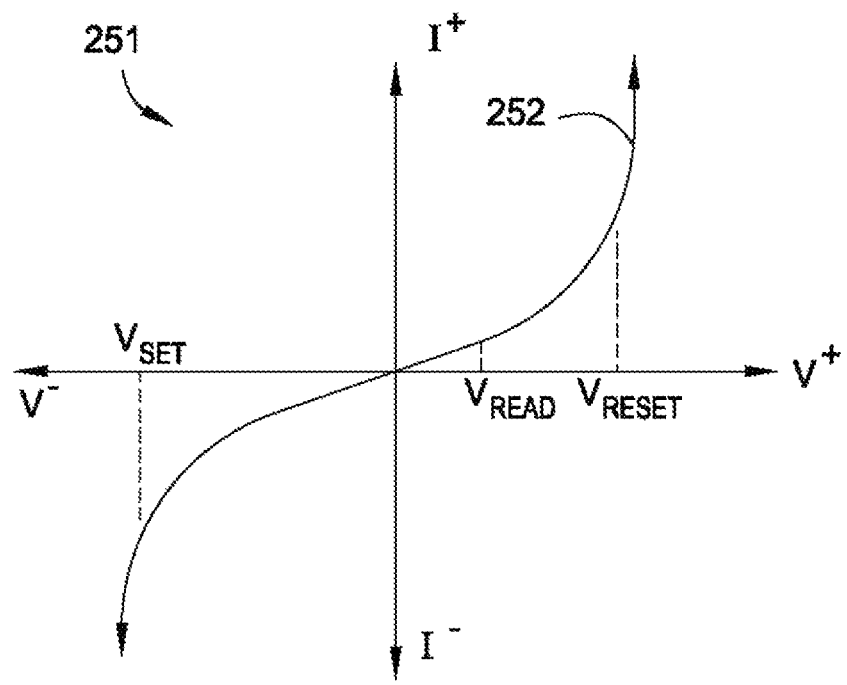
FIG. 2E

US 8,853,046 B2

USING TiON AS ELECTRODES AND SWITCHING LAYERS IN RERAM DEVICES

TECHNICAL FIELD

The present disclosure relates generally to nonvolatile memory elements and in particular to nonvolatile memory elements using titanium oxynitride ($TiO_xN_y$) films and methods of making these nonvolatile memory elements.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching memory elements typically include multiple metal oxide and nitride films between two electrodes as a resistive switching layer. The films are typically deposited as a stack of films. These multiple metal oxide and nitride films exhibit bistability, and can be placed in the high resistance state or low resistance state by applying the suitable voltages or currents. Because multiple films are used to form the resistive switching portion of the memory element, the production complexity and cost of current memory elements is high.

In addition, current resistive switching memory elements are formed in multiple semiconductor processing chambers. Each time the deposited film is moved from one chamber to another, contamination such as hydrocarbons can be introduced onto the surface of the device. These hydrocarbons can cause a bad interface between the electrodes and the resistive switching layer, which degrades the device performance and lowers the yield. Moreover, if the materials used for the electrodes and the switching layer are very different in the film composition, they can be incompatible. In particular, if the materials used for the electrode and resistive switching layer are not from the same family, such as, for example, using TiN for the electrode and $HfO_x$ for the switching layer, there are typically incompatibility issues due to interfacial mixing. These can all affect the required currents and voltages necessary to reliably set, reset and/or determine the desired "on" and "off" states of the device, increase the overall power consumption of the memory chip, increase resistive heating of the device and increase cross-talk between adjacent devices. Further developments and improvements are needed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to some embodiments of the present disclosure, a method of making a resistive memory device is provided including forming a first titanium nitride layer; forming a titanium oxynitride layer-titanium oxide layer-titanium oxynitride layer; and forming a second titanium nitride layer.

Each of the forming steps may be performed in the same chamber. The chamber may be an atomic layer deposition chamber. The chamber may be a physical vapor deposition chamber. The chamber may be a metal-organic chemical vapor deposition chamber. The chamber may include a titanium source, a nitrogen source and an oxygen source.

A resistive memory device made by the above method is also disclosed.

According to some embodiments of the present disclosure, a method of making a resistive memory device having a first electrode, a second electrode and a resistive switching material between the first electrode and the second electrode is provided, the method including forming the first electrode, second electrode and the resistive switching material in a single deposition chamber.

The single deposition chamber may be an atomic layer deposition chamber. The chamber may be physical vapor deposition chamber. The chamber may be a metal-organic chemical vapor deposition chamber.

The first electrode and second electrode may include titanium nitride and the resistive switching material may include titanium oxide. The resistive switching material may further include titanium oxynitride.

An amount of nitrogen and an amount of oxygen supplied in the chamber may vary during the formation of the first electrode, the second electrode and the resistive switching material. A first gradient of nitrogen may be supplied to the chamber and a second gradient of oxygen may be supplied to the chamber.

A resistive memory device made by the above method is also disclosed.

According to some embodiments of the present disclosure, a method of making a resistive memory device is provided characterized in that the resistive memory device is made in a single deposition chamber.

According to some embodiments of the present disclosure, a resistive memory device is provided that includes a first titanium nitride layer; a second titanium nitride layer; and a titanium oxide layer between the first titanium nitride layer and the second titanium nitride layer. The resistive memory device may further include a first titanium oxynitride layer between the titanium oxide layer and the first titanium nitride layer and a second titanium oxynitride layer between the titanium oxide layer and the second titanium nitride layer.

According to some embodiments of the present disclosure, a resistive memory device is provided having a first electrode, a second electrode and a resistive switching material between the first electrode and the second electrode. The resistive memory device includes a titanium oxynitride film, wherein a concentration of nitrogen is higher in the first electrode and the second electrode than in the resistive switching material, and wherein a concentration of oxygen is higher in the resistive switching material than in the first electrode and the second electrode.

According to some embodiments of the present disclosure, a method of making a resistive memory device is provided, including forming a first layer, the first layer comprising titanium nitride and operable as an electrode layer of the resistive memory device; forming a second layer above the first layer, the second layer comprising titanium oxy-nitride and operable as a transition layer of the resistive memory device; forming a third layer above the second layer, the third layer comprising titanium oxide and operable as a resistive switching layer of the resistive memory device; forming a fourth layer above the third layer, the fourth layer comprising titanium oxy-nitride and operable as a transition layer of the resistive memory device; and forming a fifth layer above the fourth layer, the fifth layer comprising titanium nitride and operable as an electrode layer of the resistive memory device.

Each of the forming steps may be performed in the same chamber. The chamber may be an atomic layer deposition chamber, a physical vapor deposition chamber or a metal-organic chemical vapor deposition chamber. The chamber may include a titanium source, a nitrogen source and an oxygen source.

An amount of nitrogen from the nitrogen source and an amount of oxygen supplied from the oxygen source may vary during the formation of at least the second layer, third layer and fourth layer. A first gradient of nitrogen may be supplied from the nitrogen source and a second gradient of oxygen may be supplied from the oxygen source during the formation of each of the layers.

According to some embodiments of the present disclosure, a method of making a resistive memory device is provided, including forming a first layer, the first layer operable as an electrode layer of the resistive memory device, the first layer formed from a titanium source and a nitrogen source; forming a second layer above the first layer, the second layer operable as an transition layer of the resistive memory device, the second layer formed from a titanium source, an oxygen source, and a nitrogen source; forming a third layer above the second layer, the third layer operable as a resistive switching layer of the resistive memory device, the first layer formed from a titanium source and an oxygen source; forming a fourth layer above the third layer, the fourth layer operable as an transition layer of the resistive memory device, the fourth layer formed from a titanium source, an oxygen source, and a nitrogen source; and forming a fifth layer above the fourth layer, the fifth layer operable as an electrode layer of the resistive memory device, the fifth layer formed from a titanium source and a nitrogen source.

Each of the forming steps may be performed in the same chamber. The chamber may be an atomic layer deposition chamber, a physical vapor deposition chamber or a metal-organic chemical vapor deposition chamber.

An amount of nitrogen from the nitrogen source and an amount of oxygen supplied from the oxygen source may vary during the formation of at least the second layer, third layer and fourth layer. A first gradient of nitrogen may be supplied from the nitrogen source and a second gradient of oxygen may be supplied from the oxygen source during the formation of each of the layers. At least the second layer, third layer and fourth layer may be formed as a single film, the single film including a gradient of oxygen, a gradient of nitrogen and titanium.

According to some embodiments of the invention, a resistive memory device is provided that includes a first layer comprising titanium nitride; a second layer above the first layer, the second layer comprising titanium oxy-nitride; a third layer above the second layer, the third layer comprising titanium oxide; a fourth layer above the third layer, the fourth layer comprising titanium oxy-nitride; and a fifth layer above the fourth layer, the fifth layer comprising titanium nitride.

At least the second layer, third layer and fourth layer may be formed as a single film, the single film having a gradient of oxygen, a gradient of nitrogen and titanium. The second layer, third layer and fourth layer may have a first gradient of oxygen and a second gradient of nitrogen.

A thickness of the second layer, third layer and fourth layer may be between about 20 and about 70 angstroms. A thickness of the second layer, third layer and fourth layer may be between about 30 and about 50 angstroms. A total thickness of the second layer, third layer and fourth layer may be about 70 angstroms, and a thickness of each of the second layer and fourth layer may be about 20 angstroms.

In some embodiments, the first layer may be operable as an electrode layer of the resistive memory device; the second layer may be operable as a transition layer of the resistive memory device; the third layer may be operable as a resistive switching layer of the resistive memory device; the fourth layer may be operable as a transition layer of the resistive memory device; and the fifth layer may be operable as an electrode layer of the resistive memory device.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

FIG. 2A is schematic representation of a memory device in accordance with some embodiments of the present disclosure.

FIG. 2B is schematic representation of a memory device having a diode type current steering element in accordance with some embodiments of the present disclosure.

FIG. 2E is a graph illustrating the current (I) versus voltage (V) characteristics of a bipolar switching type memory element in accordance with some embodiments of the present disclosure.

DETAILED DESCRIPTION

Embodiments of the present disclosure are also directed to a resistive memory (ReRAM) device that can be formed in a single deposition chamber. Embodiments of the present disclosure are directed to a single TiON film that is used to form a ReRAM device by, for example, varying the oxygen and nitrogen content throughout the device to form the electrodes and switching layer of the ReRAM device. The resulting ReRAM device has a gradient of nitrogen and a gradient of oxygen that result in the formation of the electrodes and the switching layer. The ReRAM device can also be formed by depositing a first titanium nitride layer, depositing a titanium oxynitride-titanium oxide-titanium oxynitride layer, and depositing a second titanium nitride layer, all in the same chamber.

Because the ReRAM device can be formed in a single chamber, hydrocarbons are not introduced onto the surface of the device. In addition, incompatibility of the materials used for the electrodes and the switching layer is not an issue because the same metal is used to form both the electrodes and the switching layer.

Figure 1:
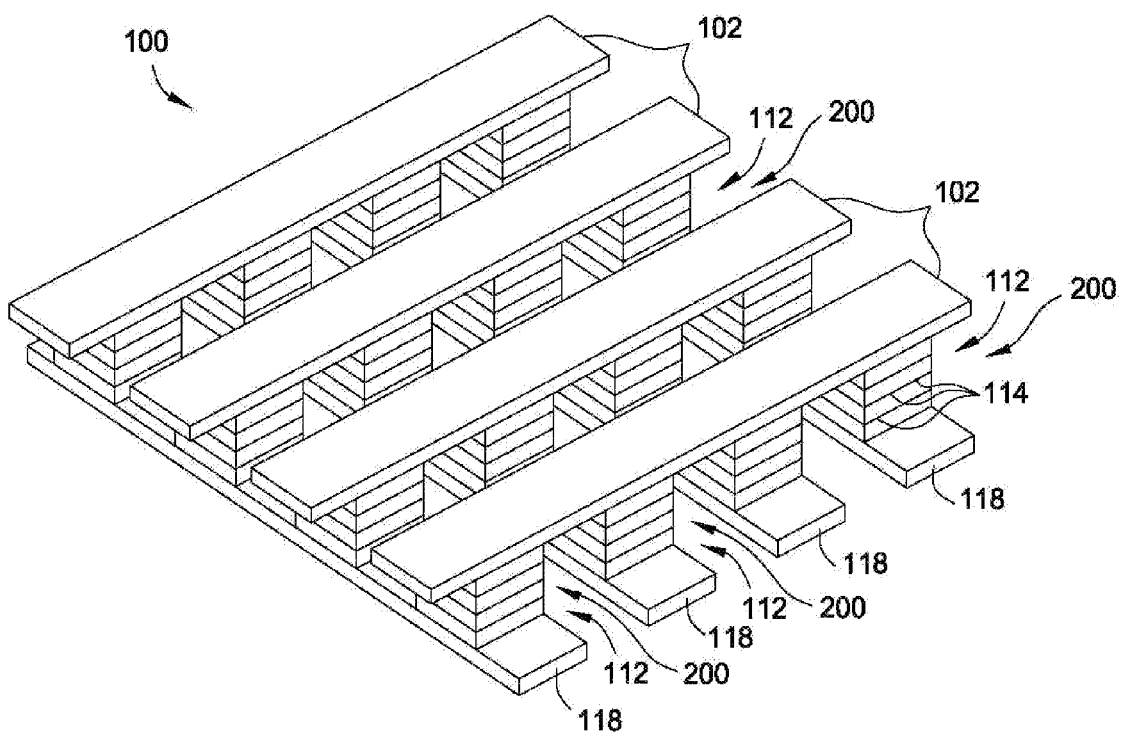
FIG. 1 illustrates an array of resistive switching memory elements in accordance with some embodiments of the present disclosure.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and orthogonal bit-lines, which are referred to herein generally as electrodes 102 and 118, and are used to read from or write data into the memory element 200. Electrodes 102 and 118, generally include one or more conductive layers that each have a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112 when that memory element is not selected to read.

FIG. 2B schematically illustrates a switching memory device 200 that contains a memory element 112 and a diode type current steering device 216 that preferentially allows current to flow through the memory device 200 in a forward direction ("I+"). However, due to the design of the current steering device 216, a reduced current can also flow in the opposing direction through the device by the application of a reverse bias to the electrodes 102 and 118.

Figure 2C:
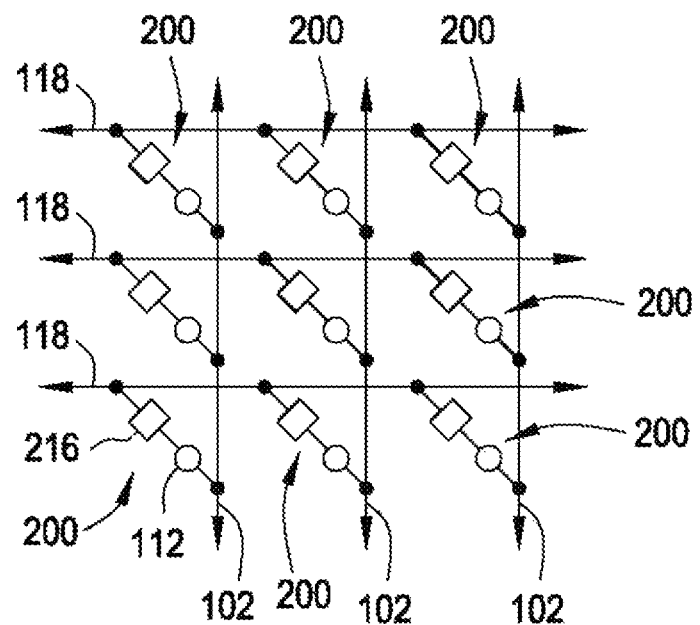
FIG. 2C is schematic representation of an array of memory devices in accordance with some embodiments of the present disclosure.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 are formed.

Figure 2D:
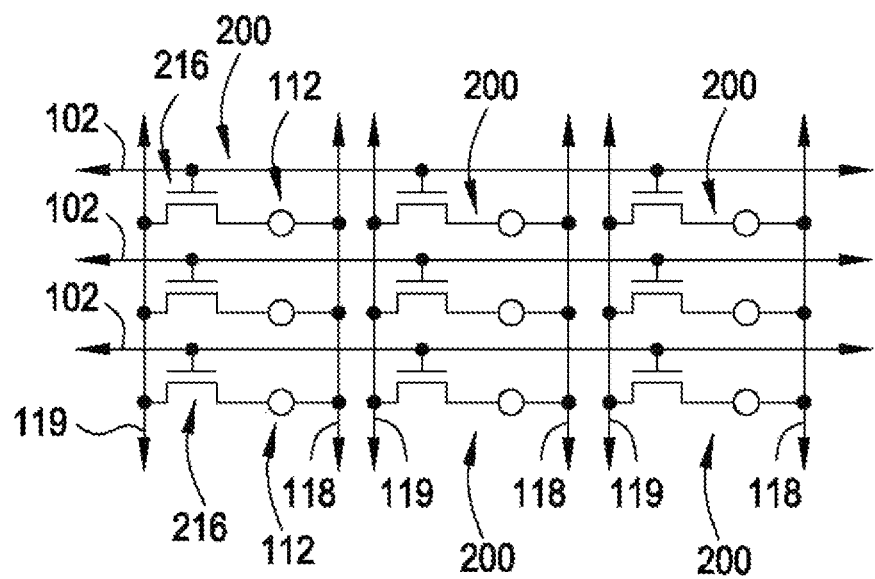
FIG. 2D is schematic representation of an array of memory devices in accordance with some embodiments of the present disclosure.

FIG. 2D schematically illustrates another embodiment of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 are formed.

During operation, such as a read operation, the state of a memory element 112 in the switching memory device 200 can be sensed by applying a sensing voltage (i.e., a "read" voltage $V_{READ}$ (FIG. 2E)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "one" (i.e., a "1" bit). If, on the other hand, the memory element is in the low resistance state, the memory element may be said to contain a logic "zero" (i.e., a "0" bit). During a write operation, the state of a memory element can be changed by application of suitable write signals to an appropriate set of electrodes 102 and 118.

In some embodiments, the memory element 112 uses bipolar switching where opposite polarity set and reset voltages are used to alter the resistance of the memory element between high and low resistance states. FIG. 2E schematically illustrates a log-log plot of current (I) versus voltage (V) (e.g., reference numeral 251) of one example of a bipolar switching curve 252 of a resistive switching type of memory element, and thus illustrates typical threshold values used to set and reset the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −2 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated"), or defects, in the resistive switching layer, or variable resistance layer 206 (FIG. 3A or 5A), when the device is reverse biased. The defects or traps, which are commonly formed during the deposition or initial burn-in or forming of the variable resistance layer 206, are often created by a non-stoichiometric material composition found in the formed variable resistance layer 206. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +2 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity, without deviating from the scope of the invention described herein.

To provide a measurable difference between the logic "zero" and logic "one" states is common to form the variable resistance layer 206 and other memory element 112 components so that the difference between the $I_{ON}$ and $I_{OFF}$ currents have a difference of at least one order of magnitude (e.g., current ratio $I_{ON}/I_{OFF}$~10). In other words, the ratio of the electrical resistances of the variable resistance layer 206 is decreased by at least 10 times when switching between the high and the low resistance states. It will be appreciated however that the difference between the $I_{ON}$ and $I_{OFF}$ currents can also be less than at least one order of magnitude (e.g., current ratio $I_{ON}/I_{OFF}$<10).

In an effort to prepare the memory element 112 for use, it is common to apply a forming voltage ($V_{FORM}$) at least once across the electrodes 102, 118 to "burn-in" the device. It is believed that the application of a forming voltage, which is typically significantly greater than the $V_{RESET}$ and $V_{SET}$ voltages, causes the defects that are formed within the variable resistance layer 206 during the device fabrication process to move, align and/or collect within various regions of the formed layer, causing the variable resistance layer 206 to consistently and reliably switch between the "on" and "off" resistive states throughout the memory element's life. In one configuration, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required at all to assure that the device will perform as desired throughout its life.

Figure 3:
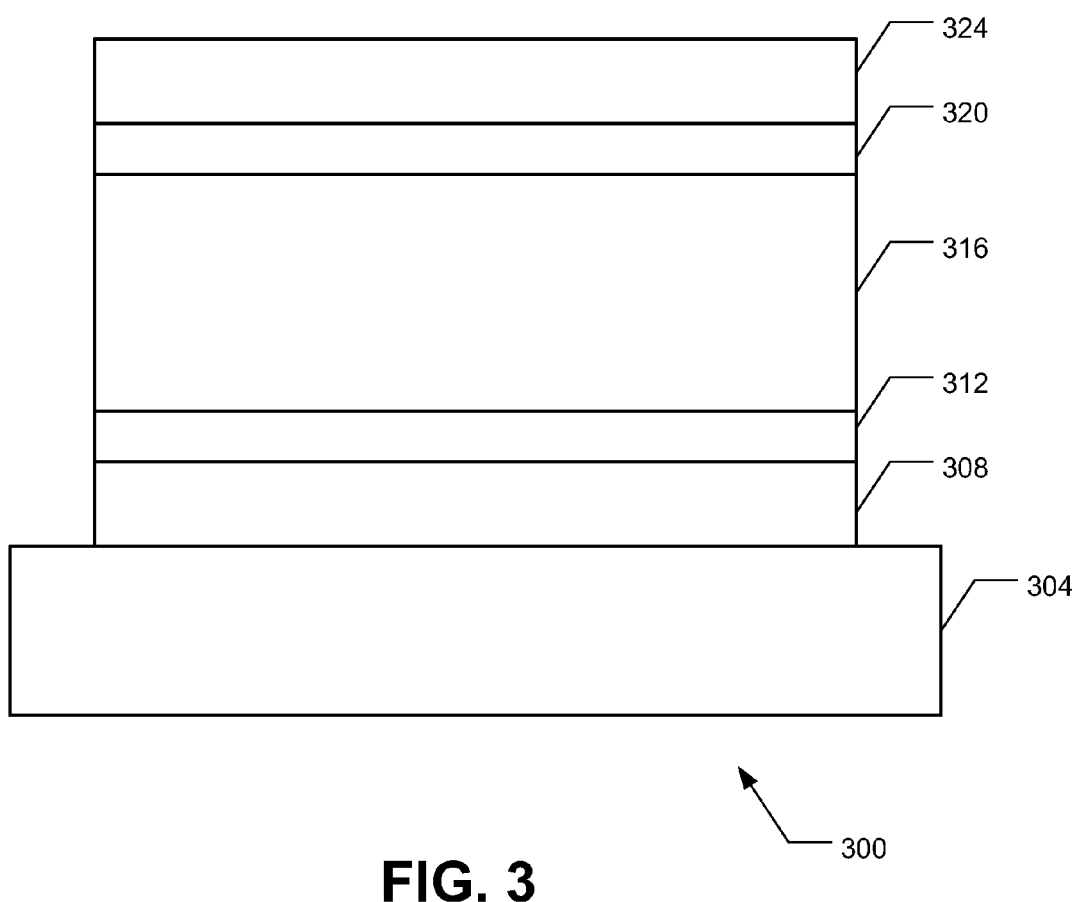
FIG. 3 is a schematic diagram of a memory device in accordance with some embodiments of the present disclosure.
Figure 4:
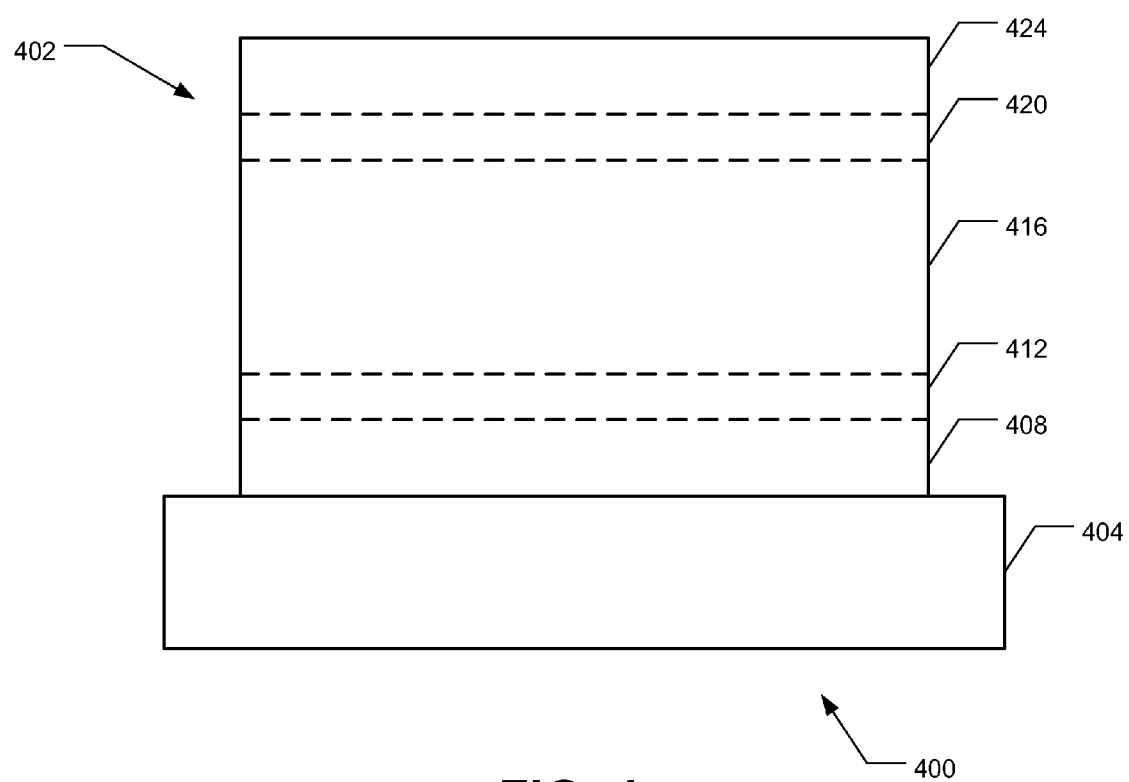
FIG. 4 is a schematic diagram of a memory device in accordance with some embodiments of the present disclosure.

As described above embodiments of the present disclosure are directed to the formation of the memory elements 112 in a single chamber. In some embodiments, the memory element 112 is formed from a combination to TiN, $TiO_xN_y$, and $TiO_x$ layers, all formed in the same chamber, and, in other embodiments, the memory element 112 is formed from one single $TiO_xN_y$ film. FIGS. 3 and 4 illustrate exemplary resistive memory elements formed in the single chamber according to embodiments of the present disclosure.

As shown in FIG. 3, the memory element 300 includes multiple layers on a base or substrate 304, a titanium nitride (TiN) layer 308, a titanium oxynitride layer ($TiO_xN_y$) 312, a titanium oxide layer ($TiO_x$) 316, a titanium oxynitride layer ($TiO_xN_y$) 320 and a titanium nitride (TiN) layer 324. The titanium nitride layers 308, 324 form the electrodes of the memory element 300 and the titanium oxide 316 forms the switching material layer of the memory element 300. The titanium oxynitride layers 312 and 320 are transition layers that may also form part of the switching material layer and/or the electrodes depending on the amount of nitrogen and/or oxygen in the layer 312, 320. The memory element 300 can be used as one or more of the memory elements 112 of the switching memory devices 200.

It will be appreciated that although the memory element 300 has been described as being formed using titanium, other metals may be used to form the memory element 300. In other words, the memory element 300 may be layers of metal nitride, metal oxynitride, metal oxide, metal oxynitride, and metal nitride. Other exemplary metals that may be used to form the memory element 300 include tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), alloys thereof, and combinations thereof.

The thickness of the electrodes may be any value or range of values between about 50 Å and about 5000 Å. The thickness of the resistance switching layer may be any value or range of values between about 10 and about 100 angstroms (Å), and in some embodiments, between about 30 and about 50 angstroms (Å).

FIG. 4 illustrates an alternative memory element 400 including a single film 402 on a base 400. The single film 402 is illustrated as having multiple layers (a first layer 408, a second layer 412, a third layer 416, a fourth layer 420 and a fifth layer 424); it will be appreciated, however, that the film 402 may not have distinct layers as shown in FIG. 4. Instead, the single film 402 includes metal and a gradient of oxygen and a gradient of nitrogen that result in the single film 402 having two electrodes and a switching layer material between the two electrodes. The first layer 408 and fifth layer 424 form the two electrodes, and the third layer 416 forms the switching material layer. The second and fourth layers, 412 and 420, respectively, are transition layers that may form part of the electrode and/or resistive switching material depending on the amount of nitrogen and/or oxygen in the layers 412, 420. The memory element 400 can be used as one or more of the memory elements 112 of the switching memory devices 200.

Figure 4A:
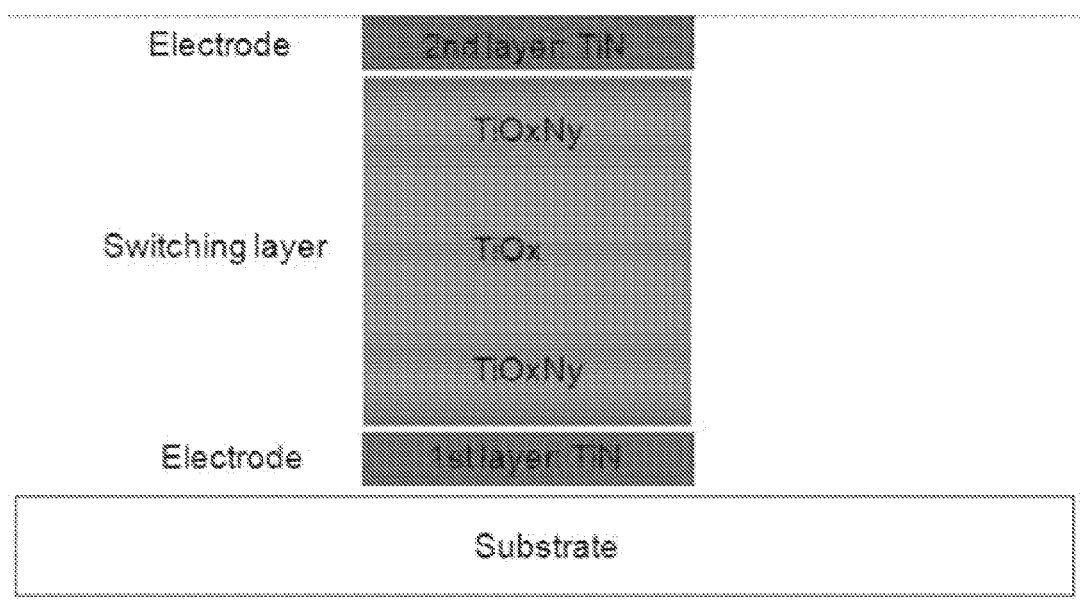
FIG. 4A is a schematic diagram of a memory device in accordance with some embodiments of the present disclosure.

In some embodiments, the single film 402 is a titanium oxynitride ($TiO_xN_y$) film, as shown in FIG. 4A. In particular, as shown in FIG. 4A, the single film 402 is a titanium oxynitride ($TiO_xN_y$) film that includes a gradient of oxygen and nitrogen. It will be appreciated that the single film 402 may be any metal oxynitride film. Other exemplary metals that may be used to form the memory element 400 include tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), alloys thereof, and combination thereof.

The thickness of the electrodes may be any value or range of values between about 50 Å and about 5000 Å. The thickness of the resistance switching layer may be any value or range of values between about 10 and about 100 angstroms (Å), in some embodiments, between about 20 and about 70 angstroms (Å), and in some embodiments, between about 30 and about 50 angstroms (Å).

In some embodiments, the thickness of the single film 402 is about 70 Å. When the thickness of the single film 402 is about 70 Å, each the TiON layers 412, 420 of the single film 402 have a thickness of about 20 Å. In some embodiments, each of the TiON layers 412, 420 are about 30% of the total dielectric thickness.

Figure 5:
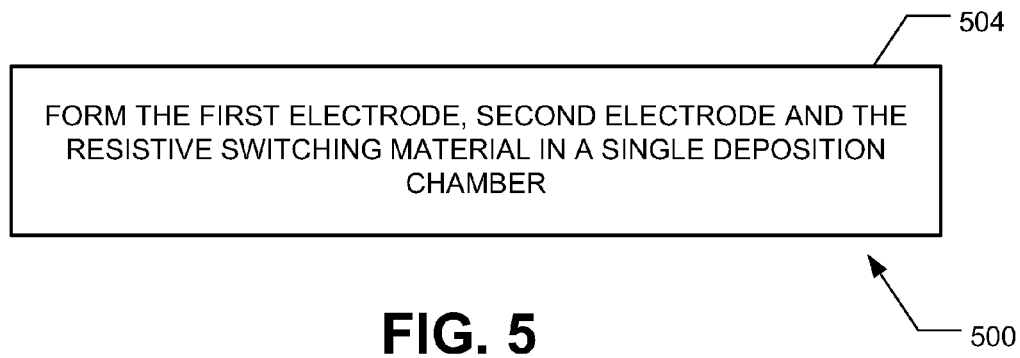
FIG. 5 is a flow diagram showing a method of making a memory device in accordance with some embodiments of the present disclosure.

FIG. 5 illustrates a method for making a memory element 500 (e.g., memory element 300 or memory element 400) according to some embodiments of the present disclosure. As shown in FIG. 5, the method 500 includes forming the first electrode, second electrode and the resistive switching material in a single deposition chamber at step 504. The memory elements 300, 400 can be formed using any desired technique, but in some embodiments the memory elements 300, 400 are formed in an ALD chamber. ALD chambers are advantageous because one material layer is deposited at a time, which can provide more precise control of the composition of the element layers 308-324, 402 of the memory elements 300, 400. For ALD, the deposition rate for material layer is typically between about 0.5 Å/cycle and about 1.0 Å/cycle. It will be appreciated that the deposition rate may be less than 0.5 Å/cycle or more than 1.0 Å/cycle. In other embodiments, the resistance switching layer can be deposited using a CVD chamber (including LPCVD (Low Pressure Chemical Vapor Deposition), PECVD (Plasma Enhanced Chemical Vapor Deposition), MOCVD (Metal Organic Chemical Vapor Deposition), and the like) or ALD chamber (including PEALD (Plasma Enhanced Atomic Layer Deposition) and the like), physical vapor deposition (PVD), liquid deposition processes, and epitaxy processes.

Figure 6:
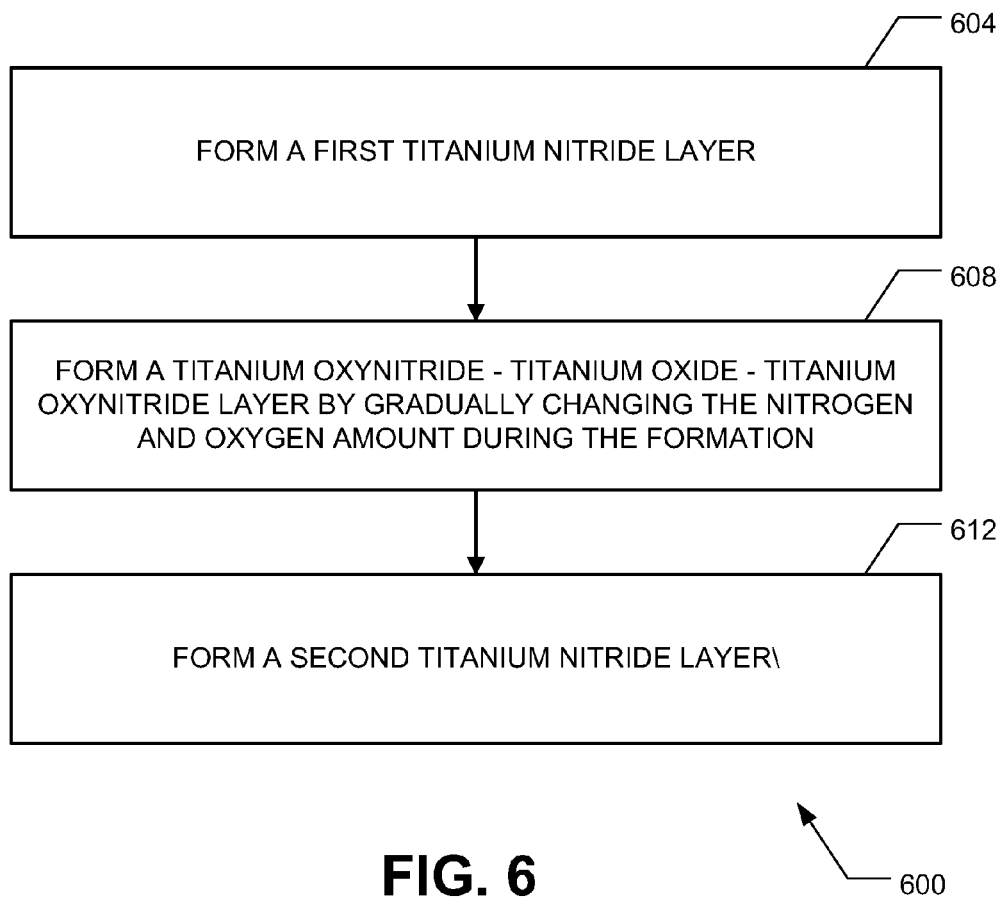
FIG. 6 is a flow diagram showing a method of making a memory device in accordance with some embodiments of the present disclosure.

FIG. 6 illustrates a more detailed method for making a memory element 600 (e.g., memory element 300 or memory element 400) according to some embodiments of the present disclosure. As shown in FIG. 6, the method 600 begins by forming a first titanium nitride layer at step 604, forming a titanium oxynitride-titanium oxide-titanium oxynitride layer by gradually changing the nitrogen and oxygen amount during the formation at step 608 and forming a second titanium layer at step 612. Each of the steps of the method 600 may be performed in a single deposition chamber, as described above with reference to FIG. 5.

Figure 7:
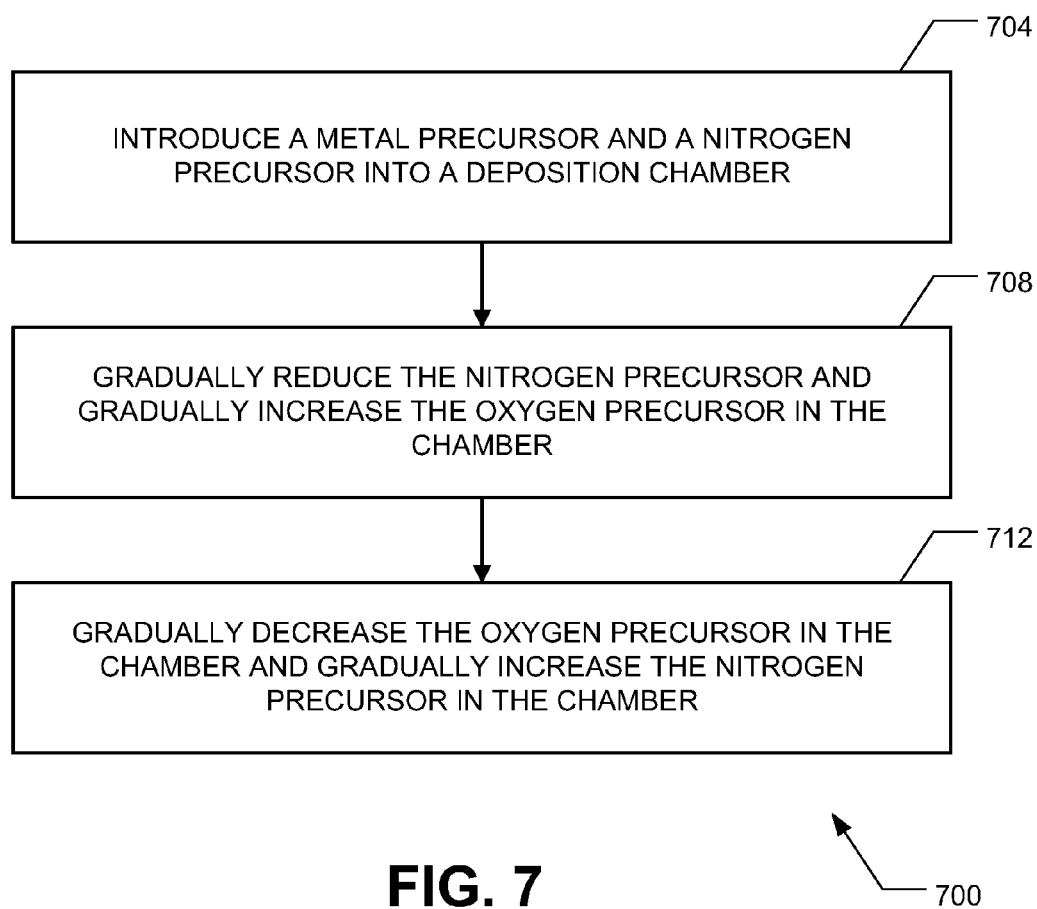
FIG. 7 is a flow diagram showing a method of making a memory device in accordance with some embodiments of the present disclosure.

FIG. 7 illustrates another more detailed method for making a memory element 700 (e.g., memory element 300 or memory element 400) according to some embodiments of the present disclosure. As shown in FIG. 7, the method begins by introducing a metal precursor and a nitrogen precursor into a deposition chamber at step 704, gradually reducing the nitrogen precursor and gradually increasing the oxygen precursor in the chamber at step 708, and gradually decreasing the oxygen precursor in the chamber and gradually increasing the nitrogen precursor in the chamber at step 712. It will be appreciated that the chamber may include a metal source (e.g., titanium source), an oxygen source (e.g., water, ozone, etc.) and a nitrogen source (e.g., ammonia).

The step of introducing the metal and nitrogen precursors at step 704 forms the metal nitride layer (e.g., layer 308, 408 of memory elements 300, 400, respectively). By gradually decreasing the nitrogen and increasing the oxygen in the chamber at step 708, the metal oxynitride and metal oxide layers are formed (e.g., layers 312/316, 412/416 of memory elements 300, 400, respectively. Similarly, by gradually increasing the nitrogen and decreasing the oxygen at step 712, the metal oxide and metal oxynitride layers (e.g., layers 316/320 and 416/420 of memory elements 300, 400, respectively) are formed. It will be appreciated that the final metal nitride layer (e.g., layer 324, 424 of memory elements 300, 400, respectively) is formed when no more oxygen is being introduced into the chamber.

Embodiments of the present disclosure are advantageous because the memory elements can be formed using a single film, decreasing the cost and increasing the manufacturing throughput. In addition, the memory elements do not have issues with incompatibility because the same metal is used in the formation of both the electrodes and the resistive switching material. In addition, because the memory element can be formed in a single chamber, hydrocarbons are not introduced onto surfaces of the memory element so there are no losses due to bad interfaces.

The present disclosure has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. A method of making a resistive memory device, the method comprising:
   (a) introducing a titanium precursor and a nitrogen precursor into a deposition chamber,
      wherein a first layer is formed on a substrate during (a), the first layer comprising titanium nitride and operable as an electrode layer of the resistive memory device;
   (b) gradually reducing a flow of the nitrogen precursor into the deposition chamber in comparison to (a) and gradually introducing an oxygen precursor into the deposition chamber,
      wherein a second layer is formed above the first layer during (b),
      the second layer comprising titanium oxy-nitride;
   (c) stopping the flow of the nitrogen precursor into the deposition chamber and gradually increasing a flow of the oxygen precursor into the deposition chamber in comparison to (b),
      wherein a third layer is formed above the second layer during (c),
      the third layer comprising titanium oxide and operable as a resistive switching layer of the resistive memory device;
   (d) gradually reducing the flow of the oxygen precursor into the deposition chamber in comparison to (c) and gradually introducing the nitrogen precursor into the deposition chamber,
      wherein a fourth layer is formed above the third layer during (d),
      the fourth layer comprising titanium oxy-nitride; and
   (e) stopping the flow of the oxygen precursor into the deposition chamber and gradually increasing a flow of the nitrogen precursor into the deposition chamber in comparison to (d),
      wherein a fifth layer is formed above the fourth layer,
      the fifth layer comprising titanium nitride and operable as an electrode layer of the resistive memory device,
      wherein at least (b), (c), and (d) are performed while the substrate remains in the deposition chamber.

2. The method of claim 1, wherein all of (a)-(e) are performed while the substrate remains in the deposition chamber.

3. The method of claim 2, wherein the deposition chamber is an atomic layer deposition chamber.

4. The method of claim 2, wherein the deposition chamber is a physical vapor deposition chamber or a metal-organic chemical vapor deposition chamber.

5. The method of claim 1, wherein the third layer has a thickness of between about 10 Angstroms and 100 Angstroms.

6. The method of claim 1, wherein a concentration of nitrogen in the second layer varies throughout a thickness of the second layer.

7. The method of claim 6, wherein the concentration of nitrogen gradually decreases in the second layer from an interface formed by the second layer with the first layer to an interface formed by the second layer with the third layer.

8. The method of claim 6, wherein a concentration of oxygen in the second layer varies throughout a thickness of the second layer.

9. The method of claim 8, wherein the concentration of oxygen gradually increases in the second layer from an interface formed by the second layer with the first layer to an interface formed by the second layer with the third layer.

10. The method of claim 1, wherein a thickness of the second layer is about 20 Angstroms.

11. The method of claim 1, wherein a thickness of the second layer is about 30% of a thickness of the third layer.

* * * * *